(12) United States Patent
Kim

(10) Patent No.: US 8,531,211 B2
(45) Date of Patent: Sep. 10, 2013

(54) SEMICONDUCTOR DEVICE

(75) Inventor: Jae-Heung Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/406,936

(22) Filed: Feb. 28, 2012

(65) Prior Publication Data
US 2013/0147536 A1 Jun. 13, 2013

(30) Foreign Application Priority Data

Dec. 8, 2011 (KR) ........................ 10-2011-0130937

(51) Int. Cl.
*H03K 3/00* (2006.01)
(52) U.S. Cl.
USPC ........................................... 327/108; 326/87
(58) Field of Classification Search
USPC ................ 326/82–87, 90, 91; 327/108, 109, 327/111, 112, 170
See application file for complete search history.

(56) References Cited

U.S. PATENT DOCUMENTS

| | | | | |
|---|---|---|---|---|
| 5,497,105 A | * | 3/1996 | Oh et al. | 326/27 |
| 5,610,548 A | * | 3/1997 | Masleid | 327/374 |
| 6,992,511 B2 | * | 1/2006 | Suzuki | 327/112 |
| 7,053,680 B2 | * | 5/2006 | Masleid et al. | 327/112 |
| 8,035,425 B2 | * | 10/2011 | Masleid et al. | 327/112 |
| 8,373,451 B1 | * | 2/2013 | Ferguson | 327/108 |
| 2011/0102024 A1 | * | 5/2011 | Lee et al. | 327/108 |

FOREIGN PATENT DOCUMENTS

KR 1020100079873 7/2010

* cited by examiner

*Primary Examiner* — William Hernandez
(74) *Attorney, Agent, or Firm* — IP & T Group LLP

(57) ABSTRACT

A semiconductor device includes a first signal delay block configured to delay a first edge of an input signal with varying delay amounts, maintain a second edge of the input signal, and output at least one first driving signal, a second signal delay block configured to delay the second edge of the input signal with the varying delay amounts, maintain the first edge of the input signal, and output at least one second driving signal, and an output pad driving block configured to drive a data output pad with a first voltage in response to the first driving signal and drive the data output pad with a second voltage in response to the second driving signal.

20 Claims, 7 Drawing Sheets

SEMICONDUCTOR DEVICE

CROSS-REFERENCE TO RELATED APPLICATIONS

The present application claims priority of Korean Patent Application No. 10-2011-0130937, filed on Dec. 8, 2011, which is incorporated herein by reference in its entirety.

BACKGROUND

1. Field

Exemplary embodiments of the present invention relate to a semiconductor design technology, and more particularly, to a data output circuit of a semiconductor device, which may prevent an occurrence of overlapping.

2. Description of the Related Art

FIG. 6 is a block diagram showing a conventional data output circuit of a semiconductor device.

Referring to FIG. 6, a conventional data output circuit of a semiconductor device includes a pre-driver 60 configured to output pull-up and pull-down control signals S1 and S2 in response to input data IN_DATA, a PMOS transistor PM configured to be turned on and off by the pull-up control signal S1 and output a power supply voltage VDD to an output terminal DQ, and an NMOS transistor NM configured to be turned on and off by the pull-down control signal S2 and output a ground voltage VSS to the output terminal DQ.

Describing operations of the conventional data output circuit of a semiconductor device, when there is no input data IN_DATA, the pre-driver 60 outputs the pull-up and pull-down control signals S1 and S2 respectively at a logic high level and a logic low level, turns off the transistors PM and NM, and disables the output terminal DQ, e.g., in a floating state.

If the input data IN_DATA of a logic high level is inputted, the pre-driver 60 outputs and applies both the pull-up and pull-down control signals S1 and S2 of logic low levels to the respective transistors PM and NM and turns on only the PMOS transistor PM such that the power supply voltage VDD is outputted to the output terminal DQ.

If the input data IN_DATA of a logic low level is inputted, the pre-driver 60 outputs and applies both the pull-up and pull-down control signals S1 and S2 of logic high levels to the respective transistors PM and NM and turns on only the NMOS transistor NM such that the ground voltage VSS is outputted to the output terminal DQ.

However, in the conventional data output circuit of a semiconductor device, in the case that the input data IN_DATA are consecutively inputted and the number of bits thereof increases, the pull-up and pull-down transistors PM and NM are to switch between turning on and off in shortened time, and an overlapping phenomenon, in which through current is produced between the power supply voltage VDD and the ground voltage VSS, may occur. As a consequence, power loss may result and an output-side circuit is likely to misoperate.

SUMMARY

An embodiment of the present invention is directed to a data output circuit of a semiconductor device, which may prevent an occurrence of overlapping.

In accordance with an embodiment of the present invention, a semiconductor device includes: a first signal delay block configured to delay a first edge of an input signal with varying delay amounts, maintain a second edge of the input signal, and output at least one first driving signals a second signal delay block configured to delay the second edge of the input signal with the varying delay amounts, maintain the first edge of the input signal, and output at least one second driving signal; and an output pad driving block configured to drive a data output pad with a first voltage in response to the first driving signal and drive the data output pad with a second voltage in response to the second driving signal.

In accordance with another embodiment of the present invention, a semiconductor device includes: a first delay operation unit configured to delay a first edge of an input signal by a first delay amount, maintain a second edge of the input signal, and output a first driving operation signal; a second delay operation unit configured to delay a first edge of the first driving operation signal by a second delay amount, maintain a second edge of the first driving operation signal, and output a second driving operation signal; a third delay operation unit configured to delay the second edge of the input signal by the first delay amount, maintain the first edge of the input signal, and output a third driving operation signal; a fourth delay operation unit configured to delay a second edge of the third driving operation signal by the second delay amount, maintain a first edge of the third driving operation signal, and output a fourth driving operation signal; a first output pad driving block configured to drive a data output pad with a first voltage in response to the first and second driving operation signals; and a second output pad driving block configured to drive the data output pad with a second voltage in response to the third and fourth driving operation signals.

DETAILED DESCRIPTION

Figure 1:
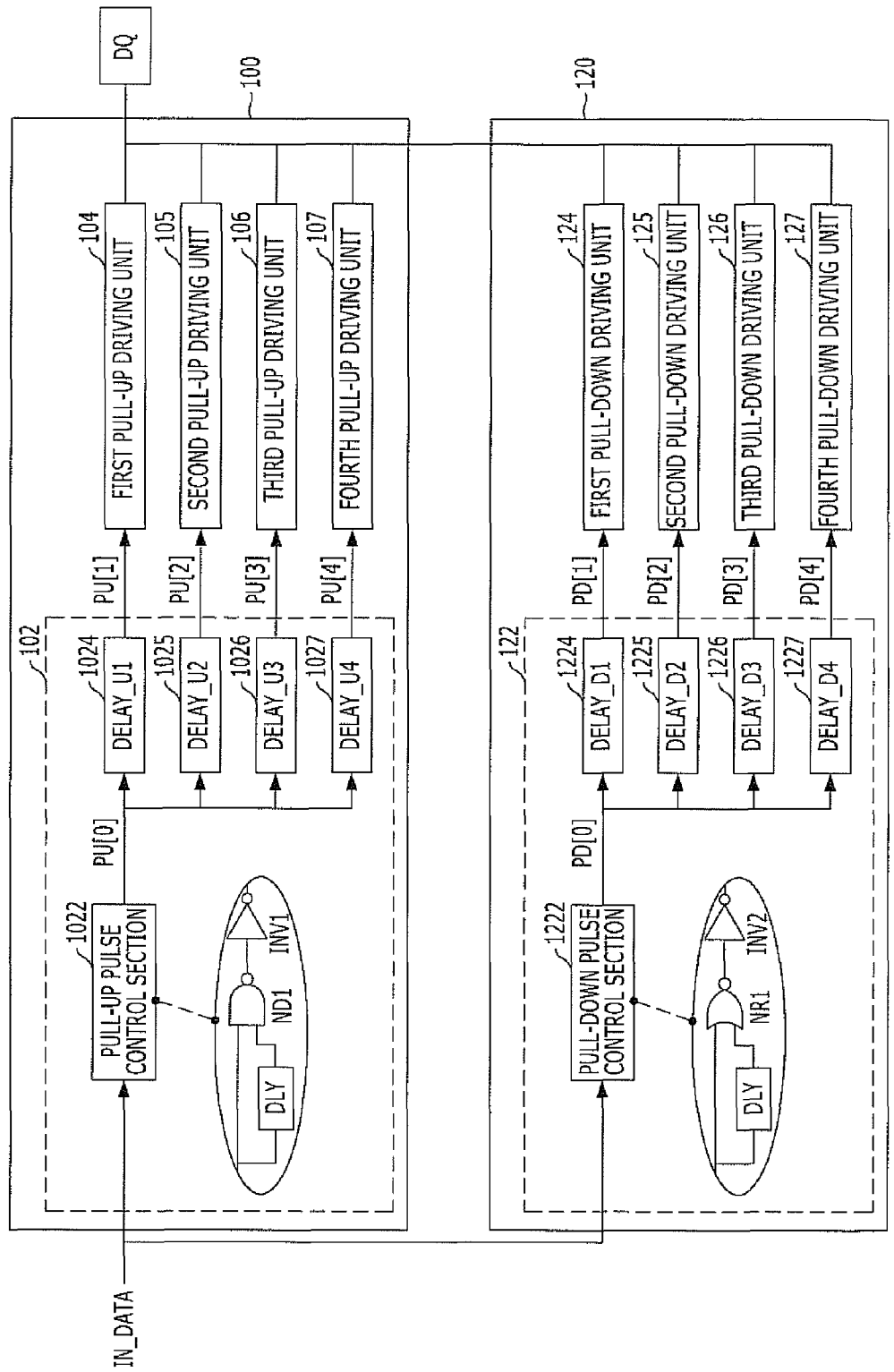
FIG. 1 is a block diagram showing a data output circuit of a semiconductor device, which may prevent an occurrence of overlapping, in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram showing a data output circuit of a semiconductor device, which may prevent an occurrence of overlapping, in accordance with an embodiment of the present invention.

Referring to FIG. 1, a data output circuit of a semiconductor device, which may prevent an occurrence of overlapping, in accordance with an embodiment of the present invention includes a pull-up operation block 100 and a pull-down operation block 120. The pull-up operation block 100 includes a pull-up signal delay unit 102 and first to fourth pull-up driving units 104, 105, 106, and 107. The pull-up signal delay unit 102 includes a pull-up pulse control section 1022 and first to fourth pull-up delay elements 1024, 1025, 1026, and 1027. The pull-down operation block 120 includes a pull-down signal delay unit 122 and first to fourth pull-down driving units 124, 125, 126, and 127. The pull-down signal delay unit 122 includes a pull-down pulse control section 1222 and first to fourth pull-down delay elements 1224, 1225, 1226, and 1227.

The pull-up operation block 100 drives a data output pad DQ to a logic high voltage level in response to an input data IN_DATA of a logic high level.

The pull-down operation block 120 drives the data output pad DQ to a logic low voltage level in response to an input data IN_DATA of a logic low level.

The pull-up pulse control section 1022 included in the pull-up signal delay unit 102 among the component parts of the pull-up operation block 100 shortens the length of a period in which the input data IN_DATA is logic high, by a predetermined delay amount to prevent the occurrence of overlapping.

In detail, the pull-up pulse control section 1022 includes a delay element DLY for delaying the input data IN_DATA by the predetermined delay amount, and a NAND gate ND1 and an inverter INV1 for logically combining (e.g., AND) the input data IN_DATA and the output data of the delay element DLY and outputting an output signal PU[0].

The pull-down pulse control section 1222 included in the pull-down signal delay unit 122 among the component parts of the pull-down operation block 120 shortens the length of a period in which the input data IN_DATA is logic low, by the predetermined delay amount to prevent the occurrence of overlapping.

In detail, the pull-down pulse control section 1222 includes a delay element DLY for delaying the input data IN_DATA by the predetermined delay amount, and a NOR gate NR1 and an inverter INV2 for logically combining (e.g., OR) the input data IN_DATA and the output data of the delay element DLY and outputting an output signal PD[0].

That is to say, the pull-up pulse control section 1022 and the pull-down pulse control section 1222 are component parts which respectively shorten the logic high period and the logic low period of the input data IN_DATA by the predetermined delay amount so as to prevent the occurrence of an overlapping phenomenon that the driving periods for the data output pad DQ to be driven to the logic high are low voltage levels, respectively, overlap with each other.

The first to fourth pull-up delay elements 1024, 1025, 1026 and 1027 included in the pull-up signal delay unit 102 among the component parts of the pull-up operation block 100 minimize a skew variation corresponding to variations in PVT (process, voltage and temperature) when driving the data output pad PQ in response to the logic high period of the input data IN_DATA.

The first to fourth pull-up delay elements 1024, 1025, 1026 and 1027 are component parts which respectively have different delay amounts, and the signals are outputted through the first to fourth pull-up delay elements 1024, 1025, 1026 and 1027 with a predetermined time difference. Therefore, in response to a logic high period of the input data IN_DATA, the data output pad DQ may be consecutively driven with the predetermined time difference. The logic high period of the input data IN_DATA outputted to the data output pad DQ may have a minimized skew in spite of variations in PVT.

The first to fourth pull-down delay elements 1224, 1225, 1226 and 1227 included in the pull-down signal delay unit 122 among the component parts of the pull-down operation block 120 minimize a skew variation corresponding to variations in PVT when driving the data output pad DQ in response to the logic low period of the input data IN_DATA.

The first to fourth pull-down delay elements 1224, 1225, 1226 and 1227 are component parts which respectively have different delay amounts, and the signals are outputted through the first to fourth pull-down delay elements 1224, 1225, 1226 and 1227 with a predetermined time difference. Therefore, in response to a logic low period of the input data IN_DATA, the data output pad DQ may be consecutively driven with the predetermined time difference. The logic low period of the input data IN_DATA outputted to the data output pad DQ may have a minimized skew in spite of variations in PVT.

The first to fourth pull-up driving units 104, 105, 106 and 107 drive the data output pad DQ with a power supply voltage VDD during periods in which respective signals PU[1:4] outputted from the pull-up signal delay unit 102 are logic high. At this time, in order to drive the data output pad DQ with the power supply voltage VDD, PMOS transistors may be used. Hence, the signals PU[1:4] outputted from the pull-up signal delay unit 102 are inverted and inputted to first to fourth PMOS transistors (not shown), so as to drive the data output pad DQ with the power supply voltage VDD.

The first to fourth pull-down driving units 124, 125, 126 and 127 drive the data output pad DQ with a ground voltage VSS during periods in which respective signals PD[1:4] outputted from the pull-down signal delay unit 122 are logic low. At this time, in order to drive the data output pad DQ with the ground voltage VSS, NMOS transistors may be used. Hence, the signals PD[1:4] outputted from the pull-down signal delay unit 122 are inverted and inputted to first to fourth NMOS transistors (not shown), so as to drive the data output pad DQ with the ground voltage VSS.

Figure 2:
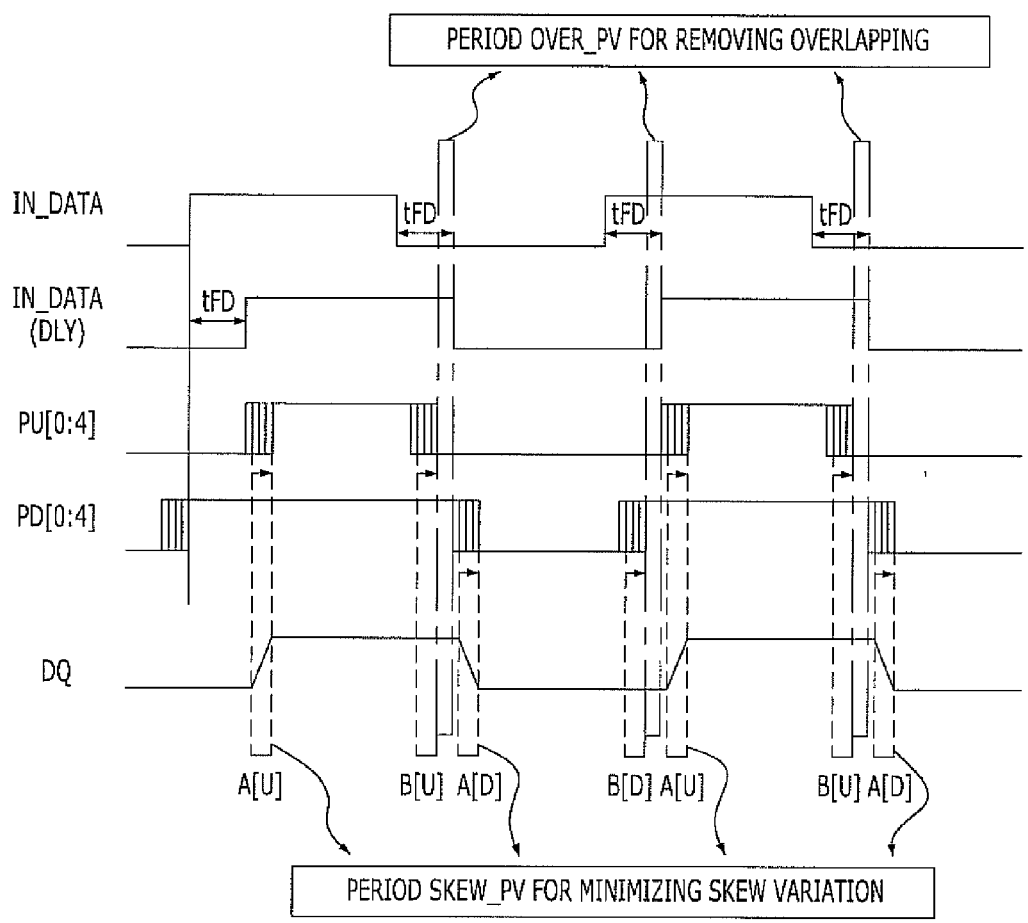
FIG. 2 is a timing diagram illustrating operations of the data output circuit of the semiconductor device shown in FIG. 1, in accordance with the embodiment of the present invention.

FIG. 2 is a timing diagram illustrating operations of the data output circuit of a semiconductor device, which may prevent an occurrence of overlapping, in accordance with the embodiment of the present invention shown in FIG. 1.

Referring to FIG. 2, for example, the input data IN_DATA having a logic high period and a logic low period alternately is inputted to the data output circuit of a semiconductor device capable of preventing an occurrence of overlapping, and changes in the voltage level of the data output pad DQ in response to such input data IN_DATA are described.

In detail, first, the input data IN_DATA and delayed input data IN_DATA(DLY) obtained by delaying the input data IN_DATA by a predetermined delay amount tFD are generated.

Further, a signal having a logic high period corresponding to an overlapping period of the logic high periods of the input data IN_DATA and the delayed input data IN_DATA(DLY) is outputted as the output signal PU[0] of the pull-up pulse control section 1022.

Also, signals obtained by stepwise delaying the output signal PU[0] of the pull-up pulse control section 1022 become the output signals PU[1:4] of the first to fourth pull-up delay elements 1024, 1025, 1026 and 1027.

In this way, the data output pad DQ is pull-up driven with the power supply voltage VDD during the periods in which the output signals PU[1:4] of the first to fourth pull-up delay elements 1024, 1025, 1026 and 1027 are logic high.

The skew of the period in which the data output pad DQ is pulled up to the level of the power supply voltage VDD is determined in response to the stepwise activations of the output signals PU[1:4] with the predetermined time difference (see A[U]). Due to this fact, even when variations in PVT occurs so that the level of the power supply voltage VDD oscillates, the skew of the period in which the data output pad DQ is pull-up driven to the level of the power supply voltage VDD may be stabilized.

Similarly, a signal having a login low period corresponding to an overlapping period of the logic low periods of the input data IN_DATA and the delayed input data IN_DATA(DLY) is outputted as the output signal PD[0] of the pull-down pulse control section 1222.

Also, signals obtained by stepwise delaying the output signal PD[0] of the pull-down pulse control section 1222 become the output signals PD[1:4] of the first to fourth pull-down delay elements 1224, 1225, 1226 and 1227.

In this way, the data output pad DQ is pull-down driven with the ground voltage VSS during the periods in which the output signals PD[1:4] of the first to fourth pull-down delay elements 1224, 1225, 1226 and 1227 are logic low.

The skew of the period in which the data output pad DQ is pulled down to the level of the ground voltage VSS is determined in response to the stepwise activations of the output signals PD[1:4] with the predetermined time difference (see A[D]). Due to this fact, even when variations in PVT occurs so that the level of the power supply voltage VDD oscillates, the skew of the period in which the JO data output pad DQ is pull-down driven to the level of the ground voltage VSS may be stabilized.

As shown in FIG. 2, the logic high periods of the output signals PU[1:4] of the first to fourth pull-up delay elements 1024, 1025, 1026 and 1027 and the logic low periods of the output signals PD[1:4] of the first to fourth pull-down delay elements 1224, 1225, 1226 and 1227 may be set not to overlap with each other.

If the activation periods of the two kinds of pulses PU[1:4] and PD[1:4] overlap with each other, through current may be produced between the first to fourth pull-up driving units 104 to 107 and the first to fourth pull-down driving unit 124 to 127 and an overlapping phenomenon may occur. In the embodiment of the present embodiment, the occurrence of the overlapping phenomenon is prevented through operations of the pull-up pulse control section 1022 and the pull-down pulse control section 1222 which delay the input data IN_DATA by the predetermined delay amount tFD.

Meanwhile, when the output signal PU[0] of the pull-up pulse control section 1022 passes through the first to fourth pull-up driving elements 1024, 1025, 1026 and 1027 to be delayed stepwise, not only the rising edge of the signal PU[0] outputted from the pull-up pulse control section 1022 is delayed (see A[U]), but also the falling edge of the signal PU[0] outputted from the pull-up pulse control section 1022 is delayed (see B[U]), to generate the output signals PU[1:4] of the first to fourth pull-up delay elements 1024, 1025, 1026 and 1027.

At this time, while the stepwise rising edges of the signals PU[1:4] outputted from the first to fourth pull-up driving elements 1024, 1025, 1026 and 1027 are to minimize a skew variation in spite of variations in PVT when driving the data output pad DQ with the power supply voltage VDD as described above, the stepwise falling edges of the signals PU[1:4] outputted from the first to fourth pull-up driving elements 1024, 1025, 1026 and 1027 may rarely exert influence on changing the voltage level of the data output pad DQ. Nevertheless, as the rising edges of the signals PU[1:4] are sequentially delayed, the falling edges of the signals PU[1:4] are delayed to be close to the falling edges of the signal PD[1:4]. The activation periods of the signals PU[1:4] and PD[1:4] may overlap each other.

Therefore, in order to stably prevent the overlapping phenomenon from occurring in the data output circuit with the configuration shown in FIG. 1, the input data IN_DATA may be delayed to generate the delayed input data by setting the predetermined delay amount tFD to have a sufficiently large value.

That is, even though the stepwise falling edges of the signals PU[1:4] may rarely exert influence on changing the voltage level of the data output pad DQ, due to such the falling edges, there are limitations in lengthening a period SKEW_PV for minimizing a pull-up skew variation of the data output pad DQ and a period OVER_PV for preventing the overlapping phenomenon from occurring. As a result, in the case that the frequency of the input data IN_DATA is very high, it is difficult to stably perform an operation for minimizing a pull-up skew variation of the data output pad DQ and an operation for preventing the overlapping phenomenon from occurring.

Similarly, when the output signal PD[0] of the pull-down pulse control section 1222 passes through the first to fourth pull-down driving elements 1224, 1225, 1226 and 1227 to be delayed stepwise, not only the falling edge of the signal PD[0] outputted from the pull-down pulse control section 1222 is delayed (see A[D]), but also the rising edge of the signal PD[0] outputted from the pull-down pulse control section 1222 is delayed (see B[D]), to generate the output signals PD[1:4] of the first to fourth pull-down delay elements 1224, 1225, 1226 and 1227.

At this time, while the stepwise falling edges of the signals PD[1:4] outputted from the first to fourth pull-down driving elements 1224, 1225, 1226 and 1227 are to minimize a skew variation in spite of variations in PVT when driving the data output pad DQ with the ground voltage VSS as described above, the stepwise rising edge of the signals PD[1:4] outputted from the first to fourth pull-down driving elements 1224, 1225, 1226 and 1227 may rarely exert influence on changing the voltage level of the data output pad DQ as shown in the drawing. Nevertheless, as the falling edges of the signals PD[1:4] are sequentially delayed, the rising edges of the signals PD[1:4] are delayed to be close to the next rising edges of the signal PU[1:4]. The activation periods of the signals PU[1:4] and PD[1:4] may overlap each other.

Therefore, in order to stably prevent the overlapping phenomenon from occurring in the data output circuit with the configuration shown in FIG. 1, the input data IN_DATA may be delayed to generate the delayed input data by setting the predetermined delay amount tFD to have a sufficiently large value.

That is, even though the stepwise rising edges of the signals PD[1:4] may rarely exert influence on changing the voltage level of the data output pad DQ, due to such the rising edges, there are limitations in lengthening a period SKEW_PV for minimizing a pull-down skew variation of the data output pad DQ and a period OVER_PV for preventing the overlapping phenomenon from occurring. As a result, in the case that the frequency of the input data IN_DATA is very high, it is difficult to stably perform an operation for minimizing a pull-down skew variation of the data output pad DQ and an operation for preventing the overlapping phenomenon from occurring.

Figure 3:
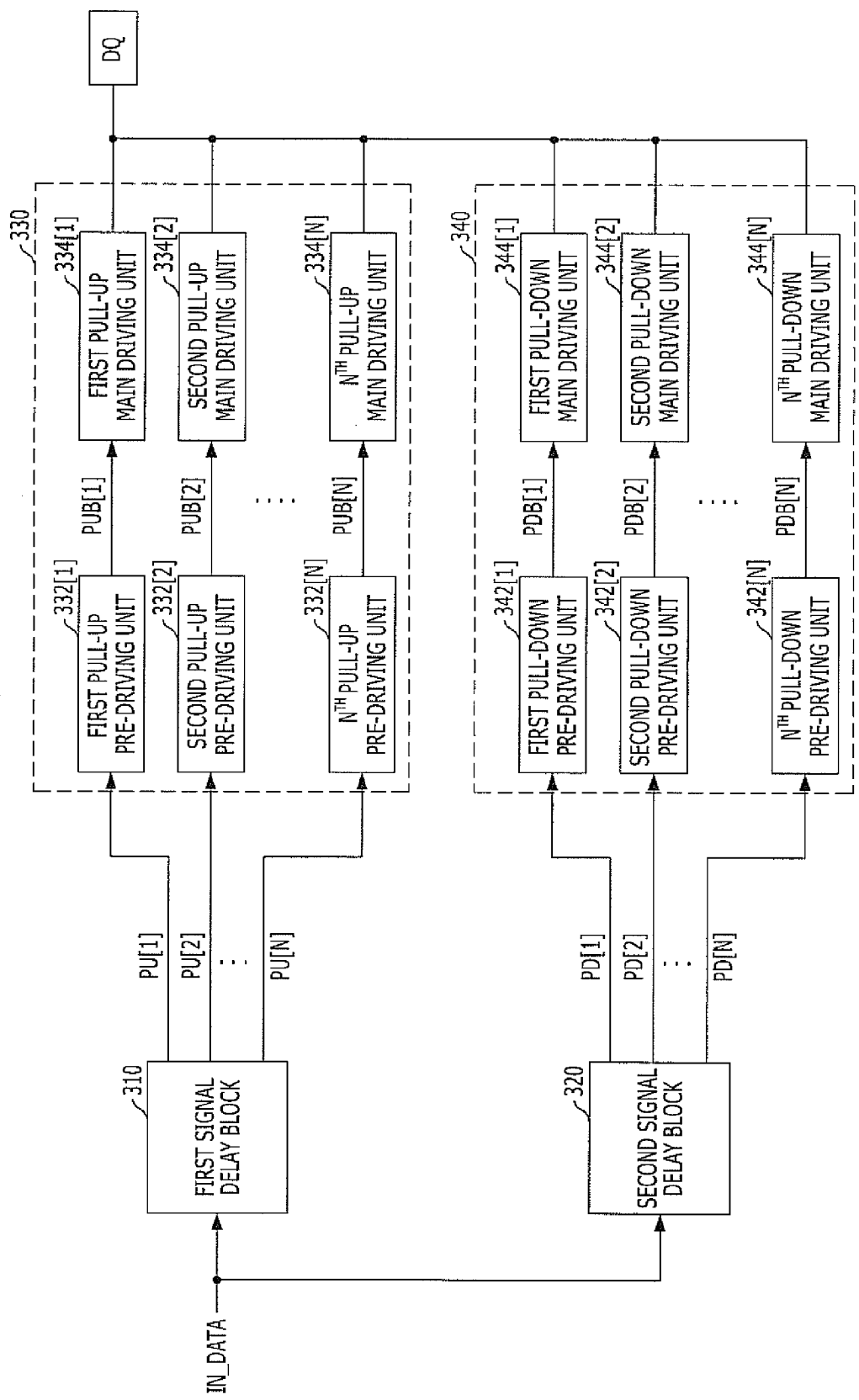
FIG. 3 is a block diagram showing a data output circuit of a semiconductor device, which may prevent an occurrence of overlapping, in accordance with another embodiment of the present invention.

FIG. 3 is a block diagram showing a data output circuit of a semiconductor device, which may prevent an occurrence of overlapping, in accordance with another embodiment of the present invention.

Figure 4A:
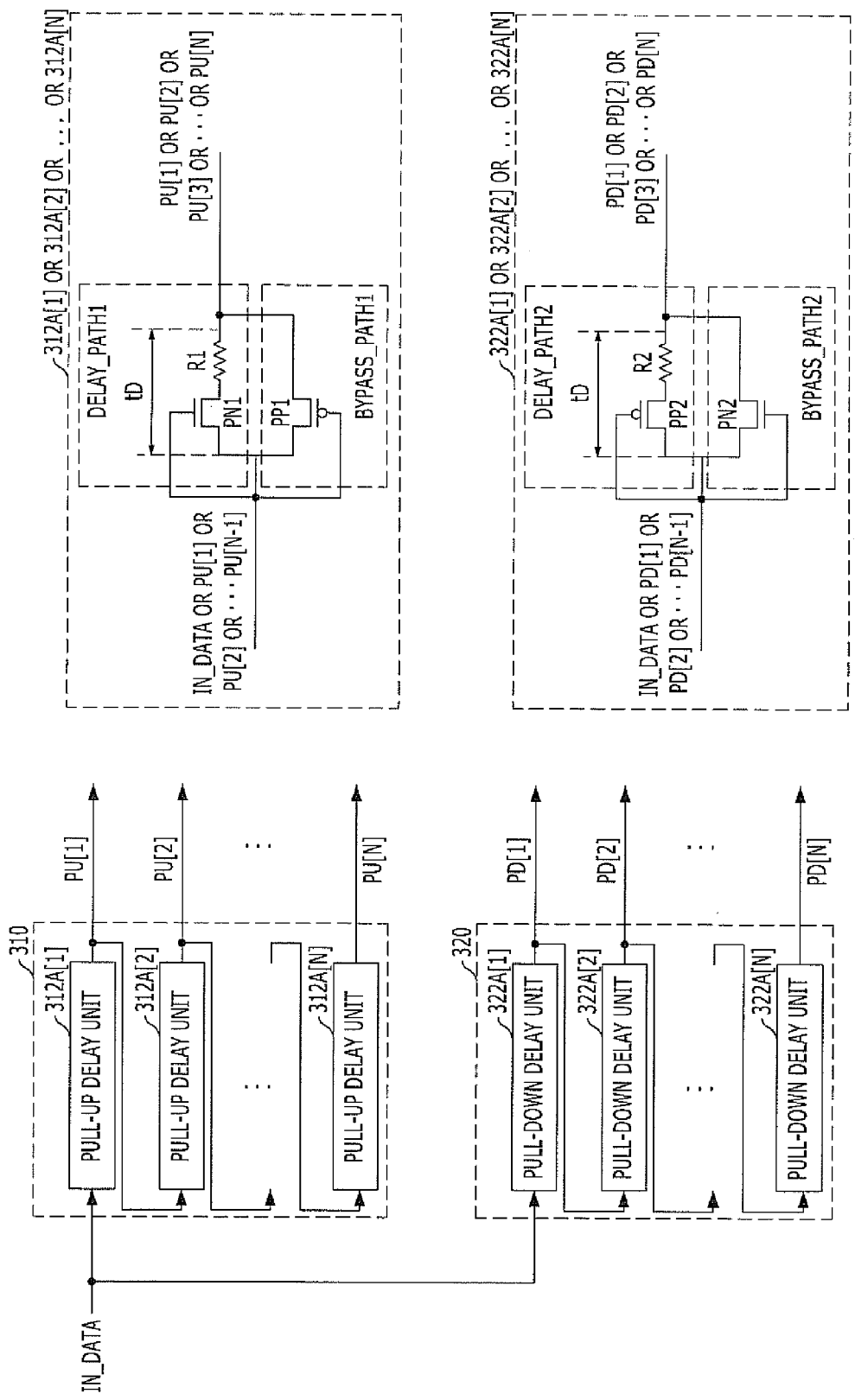
FIGS. 4A and 4B are circuit diagrams showing first and second signal delay units among the component parts of the data output circuit of the semiconductor device shown in FIG. 3, in accordance with another embodiment of the present invention.
Figure 4B:
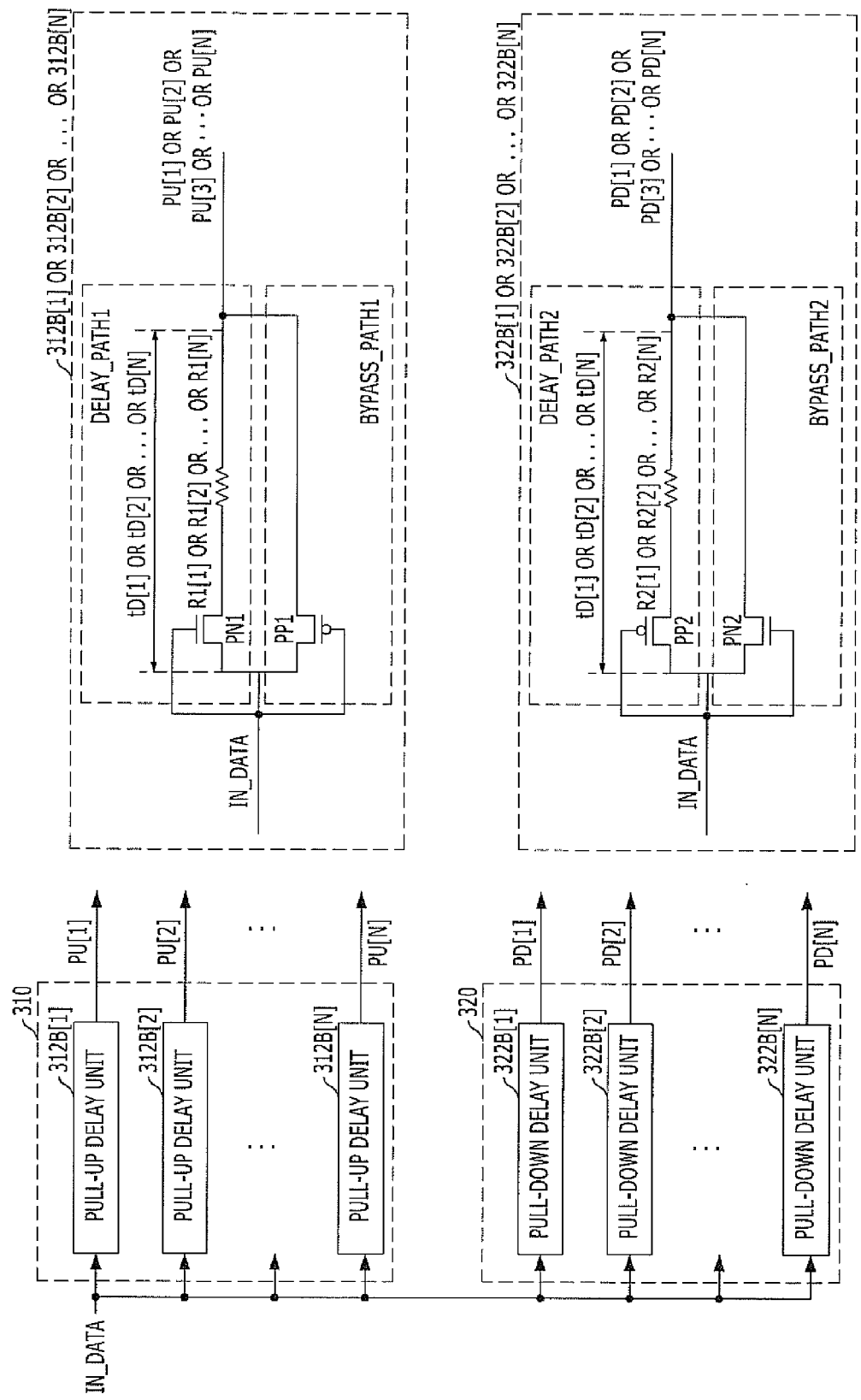

FIGS. 4A and 4B are circuit diagrams showing first and second signal delay units among the component parts of the data output circuit of a semiconductor device, which may prevent an occurrence of overlapping, in accordance with another embodiment of the present invention shown in FIG. 3.

Referring to FIG. 3, a data output circuit of a semiconductor device, which may prevent an occurrence of overlapping, in accordance with another embodiment of the present invention, includes a first signal delay block 310, a second signal delay block 320, and output pad driving blocks 330 and 340. The output pad driving blocks 330 and 340 include N number of pull-up pre-driving units 332[1:N], N number of pull-up main driving units 334[1:N], N number of pull-down pre-driving units 342[1:N], and N number of pull-down main driving units 344[1:N]. N is an integer equal to or greater than 1.

The first signal delay block 310 is configured to delay the rising edge of input data IN_DATA N times with varying delay amounts, maintain the falling edge of the input data IN_DATA, and output N number of pull-up driving signals PU[1:N]. That is to say, the first signal delay block 310 generates the N number of pull-up driving signals PU[1:N] having rising edges which are respectively delayed by N stepwise amounts from the rising edge of the input data IN_DATA. The input data IN_DATA and the N number of pull-up driving signals PU[1:N] have falling edges which are formed at the same time. Accordingly, when the logic high period and the logic low period of the input data IN_DATA are equal to each other, the N number of pull-up driving signals PU[1:N] outputted from the first signal delay block 310 have logic low periods longer than logic high periods.

The second signal delay block 320 is configured to delay the falling edge of input data IN_DATA N times with varying delay is amounts, maintain the rising edge of the input data IN_DATA, and output N number of pull-down driving signals PD[1:N]. That is to say, the second signal delay block 320 generates the N number of pull-down driving signals PD[1:N] having falling edges respectively delayed by N stepwise amounts from the falling edge of the input data IN_DATA. The input data IN_DATA and the N number of pull-down driving signals PD[1:N] have rising edges which are formed at the same time. Accordingly, when the logic high period and the logic low period of the input data IN_DATA are equal to each other, the N number of pull-down driving signals PD[1:N] outputted from the second signal delay block 320 have logic high periods longer than logic low periods.

The N number of pull-up pre-driving units 332[1:N] and the N number of pull-up main driving units 334[1:N] of the output pad driving blocks 330 and 340 are configured to drive a data output pad DQ with a power supply voltage VDD during the respective logic high periods of the N number of pull-up driving signals PU[1:N]. In order to drive the data output pad DQ with the power supply voltage VDD, the N number of pull-up main driving units 334[1:N] may include PMOS transistors, respectively. Hence, after the N number of pull-up pre-driving units 332[1:N] invert the phases of the N number of pull-up driving signals PU[1:N] and output signals PUB[1:N], the N number of pull-up main driving units 334[1:N] respectively including PMOS transistors (not shown) may be used to respectively drive the data output pad DQ with the power supply voltage VDD.

The N number of pull-down pre-driving units 342[1:N] and the N number of pull-down main driving units 344[1:N] of the output pad driving blocks 330 and 340 are configured to drive the data output pad DQ with a ground voltage VSS during the respective logic low periods of the N number of pull-down driving signals PD[1:N]. In order to drive the data output pad DQ with the ground voltage VSS, the N number of pull-down main driving units 344[1:N] may include NMOS transistors, respectively. Hence, after the N number of pull-down pre-driving units 342[1:N] invert the phases of the N number of pull-down driving signals PD[1:N] and output signals PDB[1:N], the N number of pull-down main driving units 344[1:N] respectively including NMOS transistors (not shown) may be used to respectively drive the data output pad DQ with the ground voltage VDD.

For example, the first signal delay block 310 and the second signal delay block 320 may have two types of configurations in detail as described below.

First, describing the first configuration of the first signal delay block 310 with reference to FIG. 4A, N number of pull-up delay units 312A[1:N] are connected in a chain-like style, and N number of pull-up driving signals PU[1:N] are respectively outputted from the N number of pull-up delay units 312A[1:N].

The N number of pull-up delay units 312A[1:N] delay the rising edges of the signals IN_DATA, PU[1], PU[2], ... and PU[N−1] applied thereto by a predetermined delay amount tD, maintain the falling edges of the signals IN_DATA, PU[1], PU[2], ... and PU[N−1] applied thereto, and output the N number of pull-up driving signals PU[1:N].

In detail, each of the N number of pull-up delay units 312A[1:N] includes a first delay transfer section DELAY_PATH1 which is configured to delay the signal IN_DATA, PU[1], PU[2], ... or PU[N−1] applied thereto by the predetermined delay amount tD when the signal IN_DATA, PU[1], PU[2], ... or PU[N−1] applied thereto is logic high, and a first direct transfer section BYPASS_PATH1 which is configured to transfer the signal IN_DATA, PU[1], PU[2], ... or PU[N−1] applied thereto without delay when the signal IN_DATA, PU[1], PU[2], ... or PU[N−1] applied thereto is logic low.

The first delay transfer section DELAY_PATH1 includes an NMOS transistor PN1 and a resistor R1. When the signal IN_DATA, PU[1], PU[2], ... or PU[N−1] applied to the first delay transfer section DELAY_PATH1 is logic high, the NMOS transistor PN1 turns on and transfers the applied signal to the resistor R1. The NMOS transistor PN1 turns off when the applied signal is logic low. The resistor R1 is configured to delay the signal transferred from the NMOS transistor PN1 by the predetermined delay amount tD and output the signal PU[1], PU[2], PU[3], ... or PU[N].

Similarly, the first direct transfer section BYPASS_PATH1 includes a PMOS transistor PP1 which is configured to turn on and receive the signal IN_DATA, PU[1], PU[2], ... or PU[N−1] applied to the first direct transfer section BYPASS_PATH1, when the applied signal is logic low, and turn off, when the applied signal is logic high.

In this way, in the first signal delay block 310, since the N number of pull-up delay units 312A[1:N] are connected in the chain-like style as described above, the N number of pull-up driving signals PU[1:N] are generated through first to $N^{th}$ sequential delay stages. Accordingly, a relatively small delay amount may be set to each of the N number of pull-up delay units 312A[1:N].

Of course, the delay amounts set to the N number of respective pull-up delay units 312A[1:N] may be the same with one another or may be different from one another. For example, because the delay interval between the rising edge of the input data IN_DATA and the rising edges of the N number of pull-up driving signals PU[1:N] may be determined by the delay amount of the first pull-up delay unit 312A[1] among the N number of pull-up delay units 312A[1:N], the delay amount of the first pull-up delay unit 312A[1] has a relatively large value and the delay amounts of the remaining pull-up delay units 312A[2:N] have relatively small values. For reference, the delay interval between the rising edge of the input data IN_DATA and the rising edges of the N number of pull-up driving signals PU[1:N] is to be adequately long so as to prevent the overlapping phenomenon from occurring, which will be described in detail later.

Next, describing the first configuration of the second signal delay block 320 with reference to FIG. 4A, N number of pull-down delay units 322A[1:N] are connected in a chain-like style, and N number of pull-down driving signals PD[1:N] are respectively outputted from the N number of pull-down delay units 322A[1:N].

The N number of pull-down delay units 322A[1:N] delay the failing edges of the signals IN_DATA, PD[1], PD[2], ... and PD[N−1] applied thereto by the predetermined delay amount tD, maintain the rising edges of the signals IN_DATA, PD[1], PD[2], ... and PD[N−1] applied thereto, and output the N number of pull-down driving signals PD[1:N].

In detail, each of the N number of pull-down delay units 322A[1:N] includes a second delay transfer section DELAY_PATH2 which is configured to delay the signal IN_DATA, PD[1], PD[2], ... or PD[N−1] applied thereto by the predetermined delay amount tD when the signal IN_DATA, PD[1], PD[2], ... or PD[N−1] applied thereto is logic low, and a second direct transfer section BYPASS_PATH2 which is configured to transfer the signal IN_DATA, PD[1], PD[2], ... or PD[N−1] applied thereto without delay when the signal IN_DATA, PD[1], PD[2], ... or PD[N−1] applied thereto is logic high.

The second delay transfer section DELAY_PATH2 includes a PMOS transistor PP2 and a resistor R2. When the signal IN_DATA, PD[1], PD[2], ... or PD[N−1] applied to the second delay transfer section DELAY_PATH2 is logic low, the PMOS transistor PP2 turns on and transfers the applied signal to the resistor R2. The PMOS transistor PP2 turns off when the applied signal is logic high. The resistor R2 is configured to delay the signal transferred from the PMOS transistor PP2 by the predetermined delay amount tD and output the signal PD[1], PD[2], PD[3], ... or PD[N].

Similarly, the second direct transfer section BYPASS_PATH2 includes an NMOS transistor PN2 which is configured to turn on and receive the signal IN_DATA, PD[1], PD[2], ... or PD[N−1] applied to the second direct transfer section BYPASS_PATH2, when the applied signal is logic high, and turn off, when the applied signal is logic low.

In this way, in the second signal delay block 320, since the N number of pull-down delay units 322A[1:N] are connected in the chain-like style as described above, the N number of pull-down driving signals PD[1:N] are generated through first to $N^{th}$ sequential delay stages. Accordingly, a relatively small delay amount may be set to each of the N number of pull-down delay units 322A[1:N].

Of course, the delay amounts set to the N number of respective pull-down delay units 322A[1:N] may be the same with one another or may be different from one another. For example, because the delay interval between the falling edge of the input data IN_DATA and the falling edges of the N number of pull-down driving signals PD[1:N] may be determined by the delay amount of the first pull-down delay unit 322A[1] among the N number of pull-down delay units 322A[1:N], the delay amount of the first pull-down delay unit 322A[1] has a relatively large value and the delay amounts of the remaining pull-down delay units 322A[2:N] have relatively small values. For reference, the delay interval between the falling edge of the input data IN_DATA and the falling edges of the N number of pull-down driving signals PD[1:N] is to be adequately long so as to prevent the overlapping phenomenon from occurring, which will be described in detail later.

Second, describing the second configuration of the first signal delay block 310 with reference to FIG. 4B, the first signal delay block 310 includes the N number of pull-up delay units 312B[1:N] which are configured to receive the input data IN_DATA and output the N number of pull-up driving signals PU[1:N].

The N number of pull-up delay units 312B[1:N] delay the rising edge of the input data IN_DATA by predetermined different delay amounts tD[1], tD[2], tD[3], ... d tD[N], respectively, maintain the falling edge of the input data IN_DATA, and output the N number of pull-up driving signals PU[1:N].

In detail, each of the N number of pull-up delay units 312B[1:N] includes a first delay transfer section DELAY_PATH1 which is configured to delay the input data IN_DATA by the predetermined different delay amount tD[1], tD[2], tD[3], ... or tD[N] when the input data IN_DATA is logic high, and a first direct transfer section BYPASS_PATH1 which is configured to transfer the input data IN_DATA without delay when the input data IN_DATA is logic low.

The first delay transfer section DELAY_PATH1 includes an NMOS transistor PN1 and a resistor R1[1], R1[2], R1[3], ... or R1[N]. The NMOS transistor PN1 is configured to turn on and transfer the input data IN_DATA to the resistor, when the input data IN_DATA is logic high, and turn off, when the input data IN_DATA is logic low. The resistor R1[1], R1[2], R1[3], ... or R1[N] is configured to delay the input data IN_DATA transferred from the NMOS transistor PN1 by the predetermined different delay amount tD[1], tD[2], tD[3], ... or tD[N] and output the signal PU[1], PU[2], PU[3], ... or PU[N].

Similarly, the first direct transfer section BYPASS_PATH1 includes a PMOS transistor PP1 which is configured to turn on and receive the input data IN_DATA applied to the first direct transfer section BYPASS_PATH1, when the applied signal is logic low, and turn off, when the input data IN_DATA is logic high.

In this way, in the first signal delay block 310, the N number of pull-up delay units 312B[1:N] receive the input data IN_DATA, delay the input data IN_DATA by the predetermined different delay amounts tD[1], tD[2], tD[3], ... and tD[N], respectively, and generate the N number of pull-up driving signals PU[1:N].

Therefore, the respective delay amounts tD[1], tD[2], tD[3], ... and tD[N] of the N number of pull-up delay units 312B[1:N] are set in such a manner that the delay amount tD[2] of the second pull-up delay unit 312B[2] has a value larger by a preset amount than the delay amount tD[1] of the first pull-up delay unit 312B[1] and the delay amount tD[3] of the third pull-up delay unit 312B[3] has a value larger by the preset amount than the delay amount tD[2] of the second pull-up delay unit 312B[2]. Of course, the last pull-up delay unit 312B[N] is set to have the delay amount tD[N] largest among the N number of pull-up delay units 312B[1:N].

Because the delay interval between the rising edge of the input data IN_DATA and the rising edges of the N number of pull-up driving signals PU[1:N] may be determined by the delay amount tD[1] of the first pull-up delay unit 312A[1] among the N number of pull-up delay units 312A[1:N], the delay amount tD[1] of the first pull-up delay unit 312A[1] has a relatively large value and delay intervals between delay the falling edges of the N number of pull-up delay units 312B[1:N] have relatively small values, compared to the value of the delay amount tD[1]. For reference, the delay interval between the rising edge of the input data IN_DATA and the rising edges of the N number of pull-up driving signals PU[1:N] is to be adequately long so as to prevent the overlapping phenomenon from occurring, which will be described in detail later.

Next, describing the second configuration of the second signal delay block 320 with reference to FIG. 4B, the second signal delay block 320 includes the N number of pull-down delay units 322B[1: N] which are configured to receive the input data IN_DATA and output the N number of pull-down driving signals PD[1:N].

The N number of pull-down delay units 322B[1:N] delay the falling edge of the input data IN_DATA by the predetermined different delay amounts tD[1], tD[2], tD[3], . . . and tD[N], respectively, maintain the rising edge of the input data IN_DATA, and output the N number of pull-down driving signals PD[1:N].

In detail, each of the N number of pull-down delay units 322B[1:N] includes a second delay transfer section DELAY_PATH2 which is configured to delay the input data IN_DATA by the predetermined different delay amount tD[1], tD[2], tD[3], . . . or tD[N] when the input data IN_DATA is logic low, and a second direct transfer section BYPASS_PATH2 which is configured to transfer the input data IN_DATA without delay when the input data IN_DATA is logic high.

The second delay transfer section DELAY_PATH2 includes a PMOS transistor PP2 and a resistor R2[1], R2[2], R2[3], . . . or R2[N]. The PMOS transistor PP2 is configured to turn on and transfer the input data IN_DATA to the resistor, when the input data IN_DATA is logic low, and turn off, when the input data IN_DATA is logic high The resistor R2[1], R2[2], R2[3], . . . or R2[N] is configured to delay the input data IN_DATA transferred from the PMOS transistor PP2 by the predetermined different delay amount tD[1], tD[2], tD[3], . . . or tD[N] and output the signal PD[1], PD[2], PD[3], . . . or PD[N].

Similarly, the second direct transfer section BYPASS_PATH2 includes an NMOS transistor PN2 which is configured to turn on and receive the input data IN_DATA applied to the second direct transfer section BYPASS_PATH2, when the applied signal is logic high, and turn off, when the input data IN_DATA is logic low.

In this way, in the second signal delay block 320, the N number of pull-down delay units 322B[1:N] receive the input data IN_DATA, delay the input data IN_DATA by the predetermined different delay amounts tD[1], tD[2], tD[3], . . . and tD[N] respectively, and generate the N number of pull-down driving signals PD[1:N].

Therefore, the respective delay amounts tD[1], tD[2], tD[3], . . . and tD[N] of the N number of pull-down delay units 322B[1:N] are set in such a manner that the delay amount tD[2] of the second pull-down delay unit 322B[2] has a value larger by a preset amount than the delay amount tD[1] of the first pull-down delay unit 322B[1] and the delay amount tD[3] of the third pull-down delay unit 322B[3] has a value larger by the preset amount than the delay amount tD[2] of the second pull-down delay unit 322B[2]. Of course, the last pull-down delay unit 322B[N] is set to have the delay amount tD[N] largest among the N number of pull-down delay units 322B[1:N].

Because the delay interval between the falling edge of the input data IN_DATA and the falling edges of the N number of pull-down driving signals PD[1:N] may be determined by the delay amount tD[1] of the first pull-down delay unit 322A[1] among the N number of pull-down delay units 322A[1:N], the delay amount tD[1] of the first pull-down delay unit 322A[1] has a relatively large value and delay intervals between the falling edges of the N number of pull-up delay units 312B[1:N] have relatively small values, compared to the value of the delay amount tD[1]. For reference, the delay interval between the falling edge of the input data IN_DATA and the falling edges of the N number of pull-down driving signals PD[1:N] is to be adequately long so as to prevent the overlapping phenomenon from occurring, which will be described in detail later.

Figure 5:
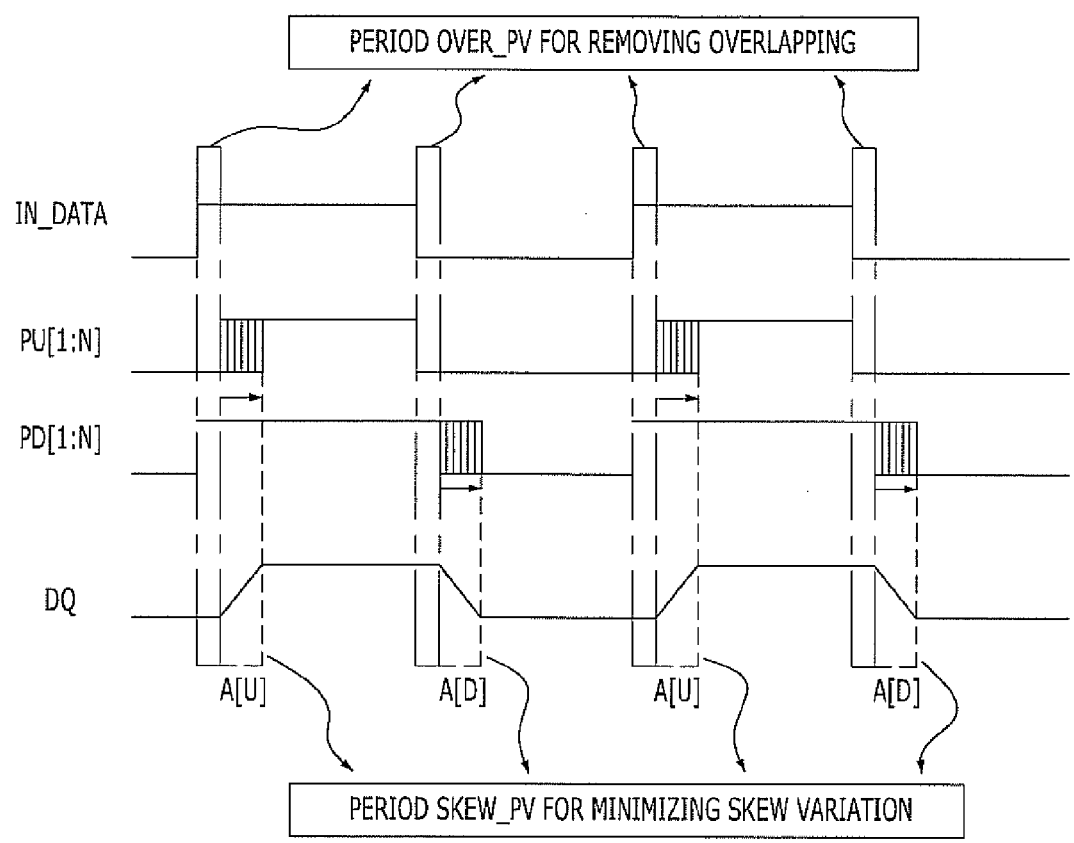
FIG. 5 is a timing diagram illustrating operations of the data output circuit of the semiconductor device shown in FIGS. 4, 4A, and 4B, in accordance with another embodiment of the present invention.
Figure 6:
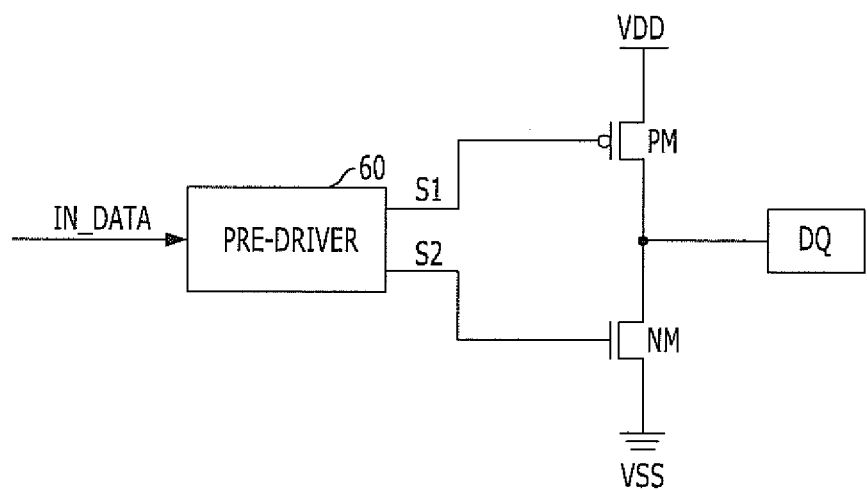
FIG. 6 is a block diagram showing a conventional data output circuit of a semiconductor device.

FIG. 5 is a timing diagram illustrating operations of the data output circuit of a semiconductor device, which may prevent an occurrence of overlapping, in accordance with another embodiment of the present invention shown in FIGS. 3, 4A and 4B.

Referring to FIG. 5, in accordance with the embodiment of the present invention, the input data IN_DATA alternately having a logic high period and a logic low period is applied to the data output circuit of a semiconductor device capable of preventing an occurrence of overlapping, and changes in the voltage level of the data output pad DQ in response to such the input data IN_DATA are described as an example.

In detail, among the N number of pull-up driving signals PU[1:N], the rising edge of the first pull-up driving signal PU[1] is delayed from the rising edge of the input data IN_DATA by a predetermined time. Also, the rising edges of the remaining pull-up driving signals PU[2:N] are sequentially delayed from the rising edge of the first pull-up driving signal PU[1] with a time difference.

While the N number of pull-up driving signals PU[1:N] have the rising edges at different times in this way, the N number of pull-up driving signals PU[1:N] have the falling edges at the same time as the falling edge of the input data IN_DATA.

Therefore, the data output pad DQ is pull-up driven with a power supply voltage VDD during the respective intervals from the rising edges to the falling edges of the N number of pull-up driving signals PU[1:N], that is, during periods in which the N number of pull-up driving signals PU[1:N] are logic high.

At this time, in response to the stepwise rising edges of the N number of pull-up driving signals PU[1:N] with the time difference, the skew of a period in which the data output pad DQ is pulled up to the level of the power supply voltage VDD is determined. In this regard, even when the level of the power supply voltage VDD fluctuates or variations in PVT occur, the skew of the period for pull-up driving the data output pad DQ to the level of the power supply voltage VDD may be kept stable.

Similarly, among the N number of pull-down driving signals PD[1:N], the falling edge of the first pull-down driving signal PD[1] is delayed from the falling edge of the input data IN_DATA by the predetermined time. Also, the falling edges of the remaining pull-down driving signals PD[2:N] are sequentially delayed from the falling edge of the first pull-down driving signal PD[1] with a time difference.

While the N number of pull-down driving signals PD[1:N] have the falling edges at different times in this way, the N number of pull-down driving signals PD[1:N] have the rising edges at the same time as the rising edge of the input data IN_DATA.

Therefore, the data output pad DQ is pull-down driven with a ground VSS during the respective intervals from the falling edges to the rising edges of the N number of pull-down driving signals PD[1:N], that is, during periods in which the N number of pull-down driving signals PD[1:N] are logic low.

At this time, in response to the stepwise falling edges of the N number of pull-down driving signals PD[1:N] with the time difference, the skew of a period in which the data output pad DQ is pulled down to the level of the ground voltage VSS is determined. In this regard, even when the level of the power supply voltage VDD fluctuates or variations in PVT occur, the skew of the period for pull-down driving the data output pad DQ to the level of the ground voltage VSS may be kept stable.

That is, while the first signal delay block 310 is applied with the input data IN_DATA and generates the N number of pull-up driving signals PU[1:N], the input data IN_DATA and the N number of pull-up driving signals PU[1:N] delayed by the predetermined delay amount and the preset time difference have the rising edges at different times and the falling edges at the same time.

Further, while the second signal delay block 320 is applied with the input data IN_DATA and generates the N number of pull-down driving signals PD[1:N], the input data IN_DATA and the N number of pull-down driving signals PD[1:N] delayed by the predetermined delay amount and the preset time difference have the falling edges at different times and the rising edges at the same time.

At this time, the failing edges of the N number of pull-up driving signals PU[1:N] and the falling edges of the N number of pull-down driving signals PD[1:N] may be set to be separated at least by a predetermined delay amount period OVER_PV and not to overlap with each other, and the rising edges of the N number of pull-down driving signals PD[1:N] and the rising edges of the N number of pull-up driving signals PU[1:N] may be set to be separated at least by the predetermined delay amount period OVER_PV and not to overlap with each other.

When the period in which the N number of pull-up driving signals PU[1:N] are logic high and the period in which the N number of pull-down driving signals PD[1:N] are logic low overlap with each other, an overlapping phenomenon results and through current is produced between the N number of pull-up main driving units 334[1:N] and the N number of pull-down main driving units 344[1:N]. Therefore, in the embodiment of the present invention, the overlapping phenomenon is prevented from resulting, through the operation of the first signal delay block 310 in which the rising edges of the first pull-up driving signal PU[1] among the N number of pull-up driving signals PU[1:N] and the input data IN_DATA are formed with a time difference corresponding to the predetermined delay amount period OVER_PV and the operation of the second signal delay block 320 in which the falling edges of the first pull-down driving signal PD[1] among the N number of pull-down driving signals PD[1:N] and the input data IN_DATA are formed with the time difference corresponding to the predetermined delay amount period OVER_PV.

That is to say, since the input data IN_DATA and the N number of pull-up driving signals PU[1:N] have the falling edges at the same time, the falling edges of the N number of pull-up driving signals PU[1:N] and the falling edges of the N number of pull-down driving signals PD[1:N] may be set stably to have the time difference corresponding to the predetermined delay amount period OVER_PV.

Similarly, since the input data IN_DATA and the N number of pull-down driving signals PD[1:N] have the rising edges at the same time, the rising edges of the N number of pull-down driving signals PD[1:N] and the rising edges of the N number of pull-up driving signals PU[1:N] may be set stably to have the time difference corresponding to the predetermined delay amount period OVER_PV.

Moreover, even when the interval from the rising edge of the first pull-up driving signal PU[1] to the rising edge of the last pull-up driving signal PU[N] is set to be sufficiently long, the interval from the rising edge to the falling edge of the last pull-up driving signal PU[N] is sufficiently long. Thus, even when the input data IN_DATA has a high frequency, the operation for preventing a pull-up skew from fluctuating due to variations in PVT may be stably performed. At this same time, the voltage level of the data output pad DQ for a logic high level may be stably maintained until the data output pad DQ is pull-down driven after being pull-up driven to a logic high level.

Similarly, even when the interval from the falling edge of the first pull-down driving signal PD[1] to the falling edge of the last pull-down driving signal PD[N] is set to be sufficiently long, the interval from the falling edge to the rising edge of the last pull-down driving signal PD[N] is sufficiently long. Thus, even when the input data IN_DATA has a high frequency, the operation for preventing a pull-down skew from fluctuating due to variations in PVT may be stably performed. At this same time, the voltage level of the data output pad DQ for a logic low level may be stably maintained until the data output pad DQ is pull-up driven after being pull-down driven to a logic low level.

As described above, in accordance with the embodiment of the present invention, the rising edges of the N number of pull-up driving signals PU[1:N] for pull-up driving the data output pad DQ and the input data IN_DATA are separated by the predetermined delay amount and the falling edges thereof are formed at the same time, and the falling edges of the N number of pull-down driving signals PD[1:N] for pull-down driving the data output pad DQ and the input data IN_DATA are separated by the predetermined delay amount and the rising edges thereof are formed at the same time. As a consequence, the logic high periods of the N number of pull-up driving signals PU[1:N] and the logic low periods of the N number of pull-down driving signals PD[1:N] may be separated from each other by the predetermined delay amount. Due to this fact, the periods for pull-up driving the data output pad DQ and the periods for pull-down driving the data output pad DQ may be kept separated from each other by the predetermined delay amount. In other words, the overlapping phenomenon may be prevented from resulting.

Furthermore, because the rising edges of the N number of pull-up driving signals PU[1:N] are formed to be delayed stepwise and the falling edges of the N number of pull-down driving signals PD[1:N] are formed to be delayed stepwise, the data output pad DQ may be pull-up and pull-down driven with a minimum skew variation in spite of variations in PVT.

In addition, the components for separating the rising edges of the N number of pull-up driving signals PU[1:N] and the input data IN_DATA by the predetermined delay amount and forming the falling edges thereof at the same time or the components for separating the falling edges of the N number of pull-down driving signals PD[1:N] and the input data IN_DATA by the predetermined delay amount and forming the rising edges thereof at the same time may be constituted by two transistors including one NMOS transistor and one PMOS transistor, thereby reducing an occupied area.

As is apparent from the above descriptions, in the embodiment of the present invention, the first edges of a signal for pull-up driving a data output pad and input data are separated by a predetermined delay amount and the second edges of the signal for pull-up driving the data output pad and the input data are generated at the same time, and the second edges of a signal for pull-down driving the data output pad and the input data are separated by the predetermined delay amount and the first edges of the signal for pull-down driving the data output pad and the input data are generated at the same time. As a consequence, the operation period of the signal for pull-up driving and the operation period of the signal for pull-down driving are separated from each other by the predetermined delay amount, thereby preventing the occurrence of overlapping.

Also, an output pad is sequentially pull-up and pull-down driven using signals obtained by sequentially delaying the first edge of the signal for pull-up driving and delaying the second edge of the signal for pull-down driving. As a consequence, the data output pad may be driven with a minimum skew variation in spite of variations in PVT (process, voltage and temperature).

While the present invention has been described with respect to the specific embodiments, it will be apparent to those skilled in the art that various changes and modifications may be made without departing from the spirit and scope of the invention as defined in the following claims.

For example, the logic gates and the transistors exemplified in the aforementioned embodiments may be realized to have different positions and kinds depending upon the polarities of the signals inputted thereto.

What is claimed is:

1. A semiconductor device comprising:
   a first signal delay block configured to delay a first edge of an input signal with varying delay amounts, maintain a second edge of the input signal, and output at least one first driving signal;
   a second signal delay block configured to delay the second edge of the input signal with the varying delay amounts, maintain the first edge of the input signal, and output at least one second driving signal; and
   an output pad driving block configured to drive a data output pad with a first voltage in response to the first driving signal and drive the data output pad with a second voltage in response to the second driving signal.

2. The semiconductor device according to claim 1, wherein the first signal delay block comprises a plurality of first delay units connected in a chain, wherein the first delay units are each configured to delay a first edge of an output signal of a previous first delay unit by a set delay amount without delaying a second edge of the output signal and output the first driving signal.

3. The semiconductor device according to claim 2, wherein the second signal delay block comprises a plurality of second delay units connected in a chain, wherein the second delay units are each configured to delay a second edge of an output signal of a previous second delay unit by the set delay amount without delaying a first edge of the output signal and output the second driving signal.

4. The semiconductor device according to claim 3, wherein each of the first delay units comprises:
   a first delay transfer section configured to delay a signal applied through a signal input terminal by the set delay amount and transfer the delayed signal to a signal output terminal, when the signal has a first logic level; and
   a first direct transfer section configured to transfer the signal to the signal output terminal without delay when the signal has a second logic level.

5. The semiconductor device according to claim 4, wherein each of the second delay units comprises:
   a second delay transfer section configured to delay a signal applied through a signal input terminal by the set delay amount and transfer the delayed signal to a signal output terminal, when the signal has the second logic level; and
   a second direct transfer section configured to transfer the signal to the signal output terminal without delay when the signal has the first logic level.

6. The semiconductor device according to claim 1,
   wherein the first signal delay block comprises at least one first delay unit configured to receive the input signal and output the first driving signal, and
   wherein the first delay unit is configured to delay the first edge of the input signal with different delay amounts without delaying the second edge of the input signal.

7. The semiconductor device according to claim 6,
   wherein the second signal delay block comprises at least one second delay unit configured to receive the input signal and output the second driving signal, and
   wherein the second delay unit is configured to delay the second edge of the input signal with the different delay amounts without delaying the first edge of the input signal.

8. The semiconductor device according to claim 1,
   wherein the first edge of the input signal includes a rising edge of the input signal from a logic low level to a logic high level,
   wherein the second edge of the input signal includes a falling edge of the input signal from the logic high level to the logic low level,
   wherein the first voltage includes a power supply voltage, and
   wherein the second voltage includes a ground voltage.

9. The semiconductor device according to claim 8, wherein the output pad driving block comprises:
   at least one first pre-driving unit configured to receive and invert the first driving signal;
   at least one first main driving unit configured to supply the power supply voltage to the data output pad in response to an output signal of the first pre-driving unit;
   at least one second pre-driving unit configured to receive and invert the second driving signal; and
   at least one second main driving unit configured to supply the ground voltage to the data output pad in response to an output signal of the second pre-driving unit.

10. A semiconductor device comprising:
   a first delay operation unit configured to delay a first edge of an input signal by a first delay amount, maintain a second edge of the input signal, and output a first driving operation signal;
   a second delay operation unit configured to delay a first edge of the first driving operation signal by a second delay amount, maintain a second edge of the first driving operation signal, and output a second driving operation signal;
   a third delay operation unit configured to delay the second edge of the input signal by the first delay amount, maintain the first edge of the input signal, and output a third driving operation signal;
   a fourth delay operation unit configured to delay a second edge of the third driving operation signal by the second delay amount, maintain a first edge of the third driving operation signal, and output a fourth driving operation signal;

a first output pad driving block configured to drive a data output pad with a first voltage in response to the first and second driving operation signals; and a second output pad driving block configured to drive the data output pad with a second voltage in response to the third and fourth driving operation signals.

11. The semiconductor device according to claim 10, wherein the first delay operation unit comprises:

a first delay transfer section configured to delay the input signal by the first delay amount to output the first driving operation signal when the input signal has a first logic level; and a first direct transfer section configured to transfer the input signal without delay to output the first driving operation signal when the input signal has a second logic level.

12. The semiconductor device according to claim 11, wherein the second delay operation unit comprises:

a second delay transfer section configured to delay the first driving operation signal by the second delay amount to output the second driving operation signal when the first driving operation signal has the first logic level; and a second direct transfer section configured to transfer the first driving operation signal without delay to output the second driving operation signal when the first driving operation signal has the second logic level.

13. The semiconductor device according to claim 12, wherein the third delay operation unit comprises:

a third delay transfer section configured to delay the input signal by the first delay amount to output the third driving operation signal when the input signal has the second logic level; and a third direct transfer section configured to transfer the input signal without delay to output the third driving operation signal when the input signal has the first logic level.

14. The semiconductor device according to claim 13, wherein the fourth delay operation unit comprises:

a fourth delay transfer section configured to delay the third driving operation signal by the second delay amount to output the fourth driving operation signal when the third driving operation signal has the second logic level; and a fourth direct transfer section configured to transfer the third driving operation signal without delay to output the fourth driving operation signal when the third driving operation signal has the first logic level.

15. The semiconductor device according to claim 10, wherein the first edges include rising edges of corresponding signals from a logic low level to a logic high level, wherein the second edges include falling edges of the corresponding signals from the logic high level to the logic low level, wherein the first voltage includes a power supply voltage, and wherein the second voltage includes a ground voltage.

16. The semiconductor device according to claim 15, wherein the first output pad driving block comprises:

a first pre-driver configured to invert a phase of the first driving operation signal;

a first main driver configured to supply the power supply voltage to the data output pad in response to an output signal of the first pre-driver;

a second pre-driver configured to invert a phase of the second driving operation signal; and a second main driver configured to supply the power supply voltage to the data output pad in response to an output signal of the second pre-driver.

17. The semiconductor device according to claim 16, wherein the second output pad driving block comprises:

a third pre-driver configured to invert a phase of the third driving operation signal;

a third main driver configured to supply the ground voltage to the data output pad in response to an output signal of the third pre-driver;

a fourth pre-driver configured to invert a phase of the fourth driving operation signal; and a fourth main driver configured to supply the ground voltage to the data output pad in response to an output signal of the fourth pre-driver.

18. The semiconductor device according to claim 10, wherein the first delay amount and the second delay amount have the same value.

19. The semiconductor device according to claim 10, wherein the first delay amount and the second delay amount have different values.

20. The semiconductor device according to claim 10, wherein the second delay operation unit is configured to output a plurality of driving operation signals having first edges at an interval of the second delay amount as the second driving operation signal, and wherein the fourth delay operation unit is configured to output a plurality of driving operation signals having second edges at an interval of the second delay amount as the fourth driving operation signal.

* * * * *